United States Patent [19]

Hsu

[11] 4,232,327

[45] Nov. 4, 1980

[54] EXTENDED DRAIN SELF-ALIGNED SILICON GATE MOSFET

[75] Inventor: Sheng T. Hsu, Lawrenceville, N.J.

[73] Assignee: RCA Corporation, New York, N.Y.

[21] Appl. No.: 959,848

[22] Filed: Nov. 13, 1978

[51] Int. Cl.² .............................................. H01L 29/78
[52] U.S. Cl. ................................... 357/23; 357/4; 357/59
[58] Field of Search ................................ 357/23, 4, 59

[56] References Cited

U.S. PATENT DOCUMENTS

| 3,296,508 | 1/1967 | Hofstein | 317/235 |
| 3,339,128 | 8/1967 | Olmsted | 317/235 |
| 3,434,021 | 3/1969 | Hofstein | 317/235 |
| 3,455,020 | 7/1969 | Dawson | 29/571 |
| 3,484,662 | 12/1969 | Hogan | 317/235 |
| 3,633,078 | 1/1972 | Dill | 317/235 R |
| 3,719,866 | 3/1973 | Naber | 317/235 R |
| 3,738,880 | 6/1973 | Laher | 148/17 |
| 3,855,610 | 12/1974 | Masuda | 357/23 |
| 3,988,761 | 10/1976 | Kanazawa | 357/41 |
| 4,193,080 | 3/1980 | Koike | 357/23 |

FOREIGN PATENT DOCUMENTS 834393 2/1970 Canada .

Primary Examiner—Martin H. Edlow
Attorney, Agent, or Firm—Birgit E. Morris; D. S. Cohen; Lawrence P. Benjamin

[57] ABSTRACT

A Metal-Oxide-Semiconductor-Field Effect Transistor (MOSFET) is described wherein a body of semiconductor material is provided with source, drain and channel regions. A gate structure is provided over the interstitial channel region of the semiconductor body between the drain and source regions, one edge of which is aligned with the source region. The remainder of the channel region, between the other edge of the gate structure and the adjacent edge of the drain region is provided with a drift region of a conductivity type that is opposite to that of the source and drain.

3 Claims, 12 Drawing Figures

EXTENDED DRAIN SELF-ALIGNED SILICON GATE MOSFET

This invention relates to semiconductor devices and more particularly to a high voltage self-aligned extended drain Metal-Oxide-Semiconductor-Field Effect Transistor (MOSFET).

Metal-Oxide-Semiconductor-Field Effect Transistors (MOSFET's) usually consist of spaced drain and source regions of one type of conductivity implanted or diffused into a body of semiconductor material of an opposite conductivity with the intervening space between the source and drain regions representing the channel region. A gate structure is formed on and insulated from the channel region, and when appropriate voltages are applied to the various elements, major carriers are derived from the source region and flow through the channel region into the drain region.

One problem that has always been apparent in MOSFET devices is the tendency toward zener or avalanche breakdown at the drain substrate junction at relatively low voltages. This breakdown voltage may be as low as 8–10 volts and therefore limits the use of such a device in an integrated circuit environment where it is desirable and frequently necessary to apply bias voltages considerably in excess of this low breakdown voltage. One attempt by the prior art to correct this defect is discussed in U.S. Pat. No. 3,339,128 which issued to J. A. Olmstead et al. on Aug. 29, 1967. In general, the invention of the Olmstead patent includes a field-effect transistor comprising a channel area and an offset gate spaced from the channel area by insulating material. The insulating material extends over the entire channel area between the source and the drain and has a thick portion positioned over that portion of the channel area adjacent the drain and has a thinner portion positioned over that portion of the channel area adjacent the source. The gate electrode extends over the thinner portion in one embodiment and over both the thin and thick portions in another embodiment.

The Olmstead patent represents an improvement over the prior art devices by reason of the fact that the thicker portion, over the drain region, is believed to displace the surface ions further from the channel whereby the electric field, induced by voltages applied to the gate electrode, will have a lesser influence on any drain current flowing through the channel.

The basic problem with the stepped oxide of the prior art is that the intrinsic or near intrinsic doping of the substrate (necessary to guarantee that the drain voltage field punches through to the channel region under the thin oxide portion of the transistor) dictates a fixed and very low threshold voltage of the transistor.

In accordance with the present invention a MOSFET is described wherein a body of semiconductor material is provided with source and drain regions and with an interstitial region, representing the channel region, therebetween. A gate member, is located over a portion of the interstitial region, adjacent to and aligned with the source region with the remainder of interstitial region being provided with a lightly doped concentration of conductivity modifiers to form a drift region.

In the Drawings:

FIGS. 1A–5A are cross-sectional views illustrating the various steps of carrying on the method of the present invention as it relates to a silicon-on-sapphire (SOS) device;

FIGS. 1B–5B are cross-sectional views illustrating the various steps of carrying on the method of the present invention as it relates to bulk silicon devices;

It should be understood that while the following exegesis will be presented in terms of an N-channel device, those skilled in the art will readily recognize that various substitutions and changes may be made herein to derive a P-channel device, without departing from the inventive concept. Further, while the SOS device will be described in terms of utilizing sapphire as an insulative substrate it should also be obvious that other, similar substrates such as spinel or monocrystalline beryllium oxide may be substituted. Such devices will be generally referred to as silicon-on-sapphire (SOS) devices.

FORMATION OF SILICON-ON-SAPPHIRE DEVICES

Figure 1A:
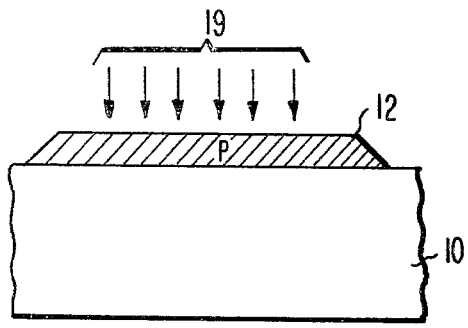
Figure 1B:
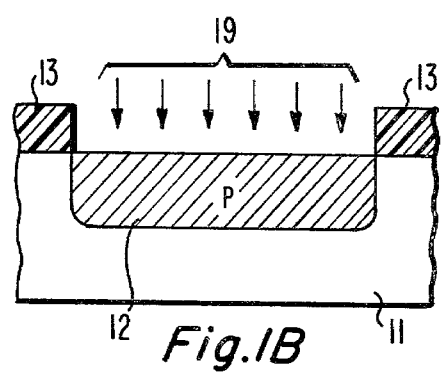

Referring now to FIG. 1A there is shown a sapphire substrate 10 on which there has been deposited a layer of silicon formed by the usual thermal decomposition of silane in an oxidizing atmosphere. Having formed a layer of silicon on the surface of substrate 10, the exposed silicon surface is now provided with a layer of apertured masking material and appropriately etched to define silicon island 12. This island 12 is usually about 0.6 μm thick but may be thinner.

Figure 2A:
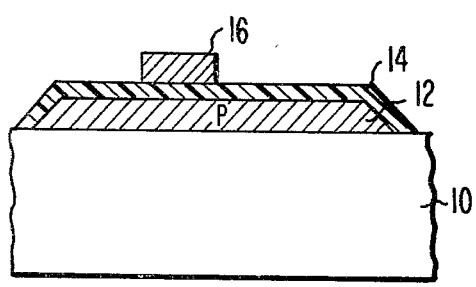
Figure 2B:
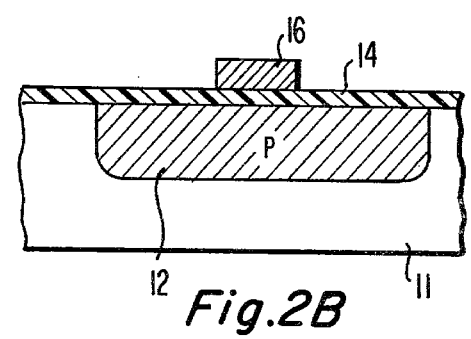

Thereafter, as shown in FIG. 2A, island 12 is doped with, for example, boron in order to form the required P type channel region for an N channel device. Using boron as a dopant, one may use a concentration of conductivity modifiers of about $10^{15}$ atoms/cm$^3$. Island 12 is then provided with a layer 14 of thermally grown silicon dioxide in order to insulate the subsequently formed gate member from the channel region. Silicon dioxide layer 14 is formed to a thickness of about 1000 Å by any one of many well known methods. Thereafter, the structure is provided with a gate member by first depositing a layer of polycrystalline silicon (polysilicon) using, for example, a chemical vapor deposition method, to a thickness of about 5000 Å. This polysilicon layer is then masked (not shown) and appropriately doped with a boron dopant so as to produce a conductivity of about 40 ohms/square. Next, the masking material is removed and the structure subjected to an etching solution consisting of, for example, aqueous hydrazine or a potassium hydroxide-proponal solution in order to remove the undoped portion of the polysilicon layer and allow the doped portion 16 to remain. This type of selective etching is described in detail in U.S. Pat. No. 3,738,880 assigned to the assignee of the subject application. This forms the structure as shown in FIG. 2A.

Figure 3A:
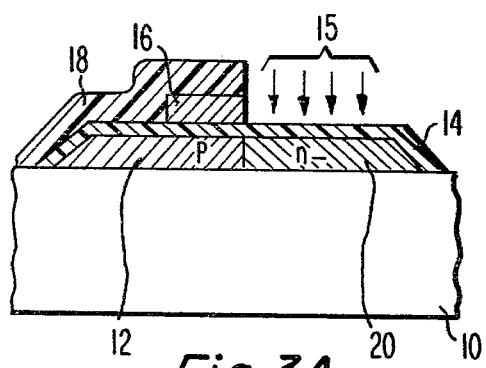

The structure is now provided with a patterned layer of photoresist material 18 which will act as a mask for the subsequent ion implantation processing as indicated by arrows 15 in FIG. 3A. Using phosphorus ions as the dopant, drift region 20 is formed using a dose of about $2 \times 10^{11}$ ions/cm$^2$ at about 50 KeV, resulting in a concentration of conductivity modifiers of about $3 \times 10^{15}$ atoms/cm$^3$.

Figure 4A:
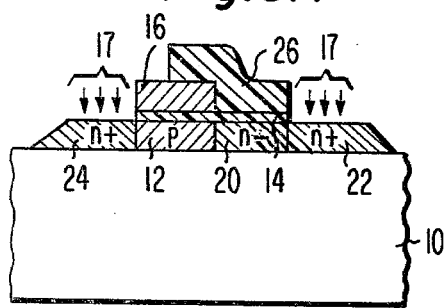

Thereafter, a layer of silicon dioxide is deposited over the entire structure using a chemical vapor deposition to a thickness of about 3000 Å. The structure is then provided with a patterned mask of photoresist (not shown) and suitably etched in a buffered hydrofluoric acid etchant to produce the layer 26 having apertures as shown in FIG. 4A, which apertures will be utilized to define the subsequently formed drain and source regions. Thereafter, as shown by arrows 17, drain region 22 and source region 24 are formed using an ion implantation process with phosphorus atoms as the dopant and a dosage of about $10^{15}$ ions/cm$^2$ resulting in a concentration of conductivity modifiers of about $2 \times 10^{19}$ atoms/cm$^3$.

Figure 5A:
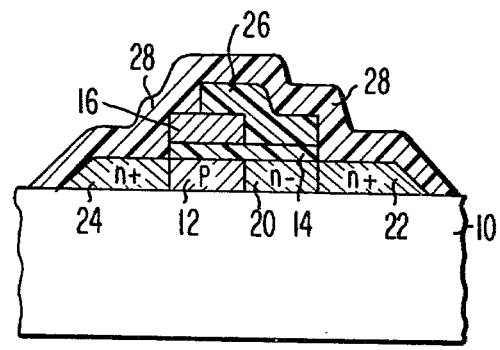
Figure 6A:
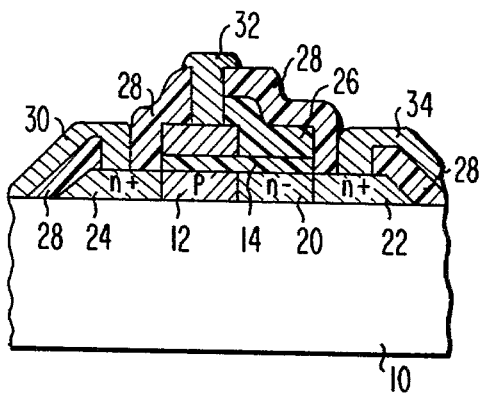
FIG. 6A is a cross-sectional view illustrating the completed silicon-on-sapphire device fabricated in accordance with the method shown in FIGS. 1A–5A.

Having now formed gate member 16, drain 22, source 24, channel region 12 and drift region 20 it is necessary to provide connecting leads thereto. This is shown in FIG. 5A wherein a layer of silicon dioxide 28 having a thickness of about 5000 Å, is formed using a chemical vapor deposition technique. Thereafter, the layered structure is suitably masked and the silicon oxide etched to form contact openings. As shown in FIG. 6A a layer of aluminum of about 14,000 Å is deposited over the entire structure, appropriately masked, and the unnecessary aluminum removed to provide contacts 30, 32 and 34 in ohmic contact with source 24, gate 16 and drain 22 respectively.

FORMATION OF BULK SILICON DEVICES

Referring now to FIGS. 1B-6B for the process steps for the formation of bulk silicon devices, there is shown a body of semiconductor material 11 on which there has been deposited a patterned layer of photoresist 13 which layer functions as a mask. The exposed portions of body 11 are subjected to a P type dopant using boron in the form of diborane in order to form P wells 12. As shown in FIG. 2B the photoresist mask is then removed and the structure subjected to the formation of gate dielectric layer 14 which may be formed either by the oxidation of the surface of body 11 or by the thermal decomposition of silane in an oxidizing atmosphere. Silicon dioxide layer 14 is formed to a thickness of about 1000 Å. Thereafter, the structure is provided with a gate member by first depositing a layer of polycrystalline silicon (polysilicon) using, for example, a chemical vapor deposition technique to a thickness of about 5000 Å. This polysilicon layer is then masked (not shown) and appropriately doped with a boron dopant in order to produce a conductivity of 40 ohms/square. Having now doped only selected areas of the polysilicon layer, the masking material is removed and the structure subjected to an etching solution consisting of, for example, aqueous hydrazine or potassium hydroxide-propanol solution in order to selectively remove the undoped portion of the polysilicon layer yet allow doped portion 16 to remain.

Figure 3B:
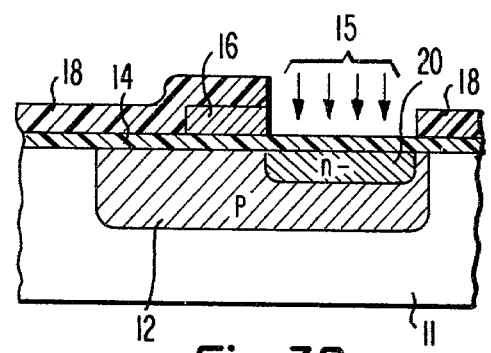

The structure is now provided with a patterned layer of photoresist material 18 which will act as a mask for the subsequent ion implantation processing, as indicated by arrows 15 in FIG. 3B. Using phosphorus ions as the dopant, region 20 is formed using a dosage of about $2 \times 10^{11}$ ions/cm$^2$ at about 50 KeV.

Figure 4B:
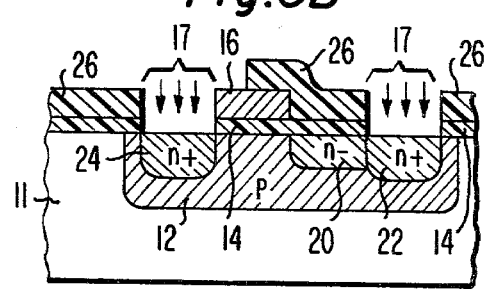

Photoresist layer 18 is then removed and the entire structure is provided with a layer of silicon dioxide which is deposited using a chemical vapor deposition to a thickness of about 3000 Å. The structure is then provided with a patterned mask of photoresit (not shown) and suitably etched in a buffered hydrofluoric acid etchant in order to produce layer 26 having apertures as shown in FIG. 4B. These apertures are used to define the subsequently formed drain and source regions. Thereafter, as shown by arrows 17, drain region 22 and source region 24 are formed using an ion implantation process with phosphorus atoms as the dopant and a dosage of about $10^{15}$ atoms/cm$^2$.

Figure 5B:
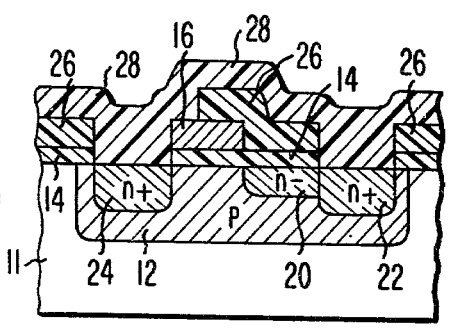
Figure 6B:
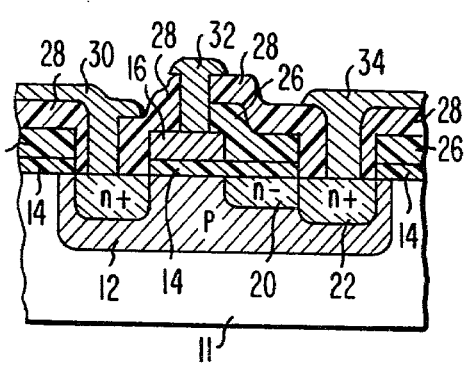
FIG. 6B is a cross-sectional view illustrating the completed bulk silicon device fabricated in accordance with the method shown in FIGS. 1B–6B.

Having formed gate member 16, drain 22, source 24, channel region 12 and drift region 20 it is now necessary to provide connecting leads thereto. This is shown in FIG. 5B wherein a layer of silicon dioxide 28, having a thickness of about 5000 Å, is formed using a chemical vapor deposition technique. Thereafter, the structure is suitably masked and silicon dioxide layer 28 is etched to form contact openings after which, as shown in FIG. 6B, 14,000 Å of aluminum is deposited in the contact openings to provide contacts 30, 32, and 34 in ohmic contact with source 24, gate 16 and drain 22 respectively.

Accordingly, Applicant has disclosed various embodiments of an improved MOSFET wherein a drift region is provided, in the interstitial portion between the source and drain regions, with the same type of conductivity modifiers as in the source and drain. Since the drift region has a lower concentration of conductivity modifiers, the resultant device will have a noticeably higher breakdown voltage.

What is claimed is:

1. In an improved extended drain field effect transistor of the type including a body of semiconductor material in which spaced drain and source regions of a first conductivity type, with a given concentration of conductivity modifiers, are embedded at the surface of the body, the drain and source regions spaced a given distance one from the other to define the channel region, a first layer of insulating material disposed over the channel region, and a gate member disposed on the first insulating layer over the channel region, the improvement comprising:

the portion of the channel region adjacent the source region having a second conductivity type opposite the first conductivity type;

the remainder of the channel region, adjacent the drain region, forming a drift region of the first conductivity type with a lower concentration of conductivity modifiers therein than the drain and source regions; and the gate member is disposed solely over the channel region with the edges thereof in alignment with respective edges of the source and drift regions.

2. The improved field effect transistor of claim 1, wherein:

the body of semiconductor material is an island of silicon formed on an insulative substrate with the drain, source, channel and drift regions colocated in the island; and the insulative substrate is selected from the group consisting of sapphire, spinel, and monocrystalline beryllium oxide.

3. The improved field effect transistor of claim 2, wherein:

the body of semiconductor material is a doped region of the second conductivity type; and the drain, source, and drift regions are of opposite conductivity type formed within the body of semiconductor material, at the surface thereof.

* * * * *